United States Patent [19]

Hughes et al.

[11] Patent Number: 6,071,791
[45] Date of Patent: *Jun. 6, 2000

[54] RADIATION-HARDENING OF MICROELECTRONIC DEVICES BY ION IMPLANTATION INTO THE OXIDE AND ANNEALING

[75] Inventors: Harold Hughes, West River, Md.; Patrick McMarr, Alexandria, Va.

[73] Assignee: The United States of America as represented by the Secretary of the Navy, Washington, D.C.

[ * ] Notice: This patent is subject to a terminal disclaimer.

[21] Appl. No.: 09/133,839

[22] Filed: Aug. 13, 1998

Related U.S. Application Data

[63] Continuation of application No. 08/655,780, May 31, 1996, Pat. No. 5,795,813.

[51] Int. Cl.$^7$ .................................... H01L 21/76
[52] U.S. Cl. ..................... 438/423; 438/407; 438/473; 438/DIG. 910
[58] Field of Search ..................... 438/405, 406, 438/423, 765, 769, DIG. 910, 473, 407

[56] References Cited

U.S. PATENT DOCUMENTS

| | | | |
|---|---|---|---|
| 4,775,641 | 10/1988 | Duffy et al. | 117/8 |
| 4,804,633 | 2/1989 | Macelwee et al. | 438/16 |
| 4,948,742 | 8/1990 | Nishimura et al. | 438/407 |
| 5,338,693 | 8/1994 | Kinzer et al. | 438/268 |
| 5,589,708 | 12/1996 | Kalnitsky | 257/646 |
| 5,795,813 | 8/1998 | Hughes et al. | 438/423 |

*Primary Examiner*—Charles Bowers
*Assistant Examiner*—Evan Pert
*Attorney, Agent, or Firm*—Barry A. Edelberg; Romulo H. Delmendo

[57] ABSTRACT

The radiation hardness of a microelectronic device is improved by implanting dopant ions, such as Si, into an oxide layer. This implantation creates electron traps/recombination centers in the oxide layer. A subsequent anneal remove defects in the active silicon layer.

10 Claims, No Drawings

RADIATION-HARDENING OF MICROELECTRONIC DEVICES BY ION IMPLANTATION INTO THE OXIDE AND ANNEALING

CROSS-REFERENCES TO RELATED APPLICATIONS

This application is a continuation application of U.S. Ser. No. 08/655,780, filed May 31, 1996 now U.S. Pat. No. 5,795,813 issued Aug. 18, 1998.

BACKGROUND OF THE INVENTION

1. Field of the Invention

The present invention relates generally to microelectronic structures, and more specifically to radiation-hardened microelectronic structures.

2. Description of the Background Art

Compared to other microelectronic device designs, silicon-on-insulator (SOI) structures inherently have some aspects of improved radiation hardness, such as for single-event effects. Even with this improved radiation hardness, however, SOI structures, when used in harsh total-dose environments, are still prone to radiation-induced failure due to positive charge build up in the buried oxide layer (BOX). This radiation-induced charge build-up in the BOX causes deleterious changes in the device operating parameters, such as back-channel threshold voltage and leakage current.

The prior art has, to a limited extent, mitigated this problem by implanting positively charged ions, such as boron, into the silicon substrate to raise the back-channel threshold voltage. Additional improvements in radiation hardness, however, are desirable for long term usage of SOI structures in harsh environments such as outer space, nuclear reactors, and particle accelerators. Additionally, improved radiation hardness is growing increasingly useful as semiconductor processing becomes more radiative. For example, processing techniques such as reactive ion etching and plasma etching introduce some radiation damage into the fabricated semiconductor structure.

SUMMARY OF THE INVENTION

Accordingly, it is an object of this invention to provide a microelectronic device having increased radiation hardness.

Accordingly, it is another object of the present invention to provide a radiation-hardened microelectronic device having prolonged lifespan in harsh environment.

These and other objects are achieved by providing deep electron traps/recombination centers in the oxide. The deep electron traps/recombination centers may be formed by implanting a dopant ion such as silicon, aluminum, arsenic, germanium, boron, or nitrogen, into the oxide layer of a microelectronic device. Typically, the dopant is implanted as a positive ion.

DESCRIPTION OF THE PREFERRED EMBODIMENTS

A typical SOI includes a silicon substrate, an active silicon layer, and a buried oxide layer sandwiched between the active silicon layer and the silicon substrate. Generally, the buried oxide layer rests directly on and physically contacts the silicon substrate. Also, the active silicon layer generally rests on and physically contacts the buried oxide layer. The buried oxide layer electrically isolates the active silicon layer from the silicon substrate.

When high energy particles pass through the active Si layer of an SOI, they generate electron-hole pairs within the BOX. In conventional SOI structures, most of the electrons thus formed in the BOX, being mobile when the device is biased, leave the BOX and enter the silicon substrate. Holes, however, are not as mobile. Thus, each high energy particle that passes through the active Si layer structures increases the positive charge within the BOX. Over time, the positive charge in the BOX increases until product failure results.

The present invention, by creating deep electron traps/recombination centers in the BOX layer, prevents the needed electrons from escaping the BOX. Thus, the BOX remains nearly neutral and the function of the structure is preserved.

The dopant ion implanted into the BOX should be capable of tightly bonding with any free electrons that might be formed by radiation damage. In this regard, implanted aluminum, aresenic, boron, Si, and nitrogen atoms perform well. For best results, the implanted species is preferably non-segregable and does not redistribute within the BOX at typical temperatures of preparation and use. Most preferably, the ion is one that can be implanted into the BOX at significant doses without significantly altering the electrical properties of the SOI structure. For this reason, Si is the most preferable implant species. Either $^{28}$Si or $^{29}$Si may be implanted in the BOX according to the present invention ($^{27}$Si is used when contamination by $N_2$ is present).

The dose of implanted ion should be as high as can be obtained without damaging the active Si layer to such an extent that a subsequent anneal will not essentially rectify the damage. For the implantation of $Si^+$ ions into the BOX, the implantation dose should be about $10^2$–$10^{14}$ ions/cm$^2$. Below about $10^{12}$ ions/cm$^2$, the implantation of $Si^+$ ions the BOX has little radiation hardening effects. Above about $5 \times 10^{14}$ ions/cm$^2$, the implantation of $Si^+$ ions into the BOX damages the active $Si^+$ layer to such an extent that the damage cannot be essentially rectified by subsequent annealing.

To minimize damage to the active Si layer during implantation into the BOX, ion implantation is preferably channeled. For example, in <100> Si, channeling at 0° is preferred. Channeling, however, is not required according to the present invention.

The energy of the implant determines the depth of the implant. Generally, the dopant ion should be implanted in the BOX at a depth near the interface of the active Si layer and the BOX. Thus, the concentration of the implanted ion should peak into the top half of the buried oxide layer. However, the concentration of the dopant ion is best implanted sufficiently deep into the BOX to alleviate concerns with hot carriers from the active silicon region. Generally, hot carriers can be injected to a maximum depth of 100 Å beneath the active Si/BOX interface into the BOX. Although no hot carriers have been observed in structures made according to the present invention, any concerns over hot carriers may also be alleviated by, for example, oxidizing the implanted species within the first 100 Å of the BOX. This oxidation may be performed by placing the implanted SOI structure in a heated (typically about 1100 to below the melting point of Si, usually to about 1380° C.), oxidizing atmosphere until the desired oxide layer thickness is grown. The thickness can be measured by any suitable technique, such as spectroscopic ellipsometry or profilometry. This additional oxygen may also be supplied by a low-dose supplemental oxygen implantation.

As an example of a typical implant depth, in a typical SOI with a 1300 Å thick Si active layer (also referred to as an "Si overlayer"), Si is implanted into the buried oxide layer so as to provide a peak concentration at about 1000 Å from the Si active layer/buried-oxide interface, and the buried oxide layer extends for a depth of about 4000 Å from this interface.

The implant energy required to obtain the desired implantation profile in the BOX layer will vary depending upon the implanted species, the thickness of the active Si layer and the angle of implantation. Other factors, such as the density of the BOX may also effect the required implantation energy. Thus, the energy required to obtain the desired implantation profile in the BOX is best determined empirically for each situation, using the knowledge of those skilled in the art of ion implantation. Conveniently, ion implantation is performed at room temperature.

The active Si layer may be any thickness used in the art of SOI structures. Nevertheless, it is desirable to keep the Si layer at the minimum thickness needed for the function and facile fabrication of the SOI structure. As the thickness of the active Si layer increases, higher implant energies are required to implant $Si^+$ at the desired depth in the BOX. As implant energy increases, so does the implant damage to the active Si layer.

Post-implantation annealing may be performed at temperatures as low as about 800° C. Typically, however, the implanted SOI is annealed at above 950° C. Annealing removes residual damage in the active Si layer and stabilizes the Si-implanted buried oxide layer. At very low temperatures (below about 800° C.) no significant annealing occurs. At very high temperatures, either the Si active layer melts (the melting point of Si is about 1405° C.) or contamination from the furnace becomes a greater concern. Thus, while annealing can theoretically occur at melting points up to about 1405° C., the annealing temperatures is generally about 1100° C. or less to reduce the risk of contamination. At higher annealing temperature, annealing requires less time. Generally, annealing is performed for about 1–5 hours. A typical annealing time at 1000° C. is about 3 hours. If the annealing time is overly long, the Si in the substrate may begin to reduce the BOX layer. Generally, this post-implantion anneal is performed either in vacuo or under an atmosphere that is non reactive with the SOI structure.

The present invention may be performed using SOI structures made by any method used in the art. Typically methods for making SOI structures include SIMOX (Separation by the Implantation of Oxygen) and the bond and etch back method.

SOI structures made according to the present invention typically have a radiation hardness of about 50 krads to about 100 krads. This degree of radiation hardness is significantly higher than that readily obtainable according to the prior art. The method of the present invention is not needed to produce SOI structures having a radiation hardness of less than about 20 krads.

Obviously, many modifications and variations of the present invention are possible in light of the above teachings. It is therefore to be understood that, within the scope of the appended claims, the invention may be practiced otherwise than as specifically described.

What is claimed is:

1. A method of increasing the radiation hardness of a microelectronic device, said device including a silicon substrate, an active silicon layer, and an oxide layer, said method including the steps of:

implanting, at an energy needed for ion implantation, a dopant ion selected from the group consisting of Al, As, B, N, Ge, and Si ions into said oxide layer while exposing said active silicon layer to said dopant ions at said ion implantation energy;

annealing said implanted device at a temperature of from about 800° C. to below the melting point of silicon;

said implanting step being performed at a dose selected so that any damage to said active silicon layer caused by said implantation is repaired during said annealing step and so that said implanting step causes said annealed device to have a significantly increased radiation hardness.

2. The method of claim 1, wherein said implanted ion is $Si^+$.

3. The method of claim 2, wherein said dose is about $10^{12}$ to about $5 \times 10^{14}$ ions/cm$^2$.

4. The method of claim 2, wherein said annealing is performed at a temperature of about 80020 C. to about 1400° C.

5. The method of claim 4, wherein said annealing is performed at a temperature of about 950° C. to about 1100° C.

6. The method of claim 1, wherein said method produces an annealed silicon insulator device having a radiation hardness of about 50 krads to about 100 krads.

7. The method of claim 1, wherein said annealing is carried out at a temperature above 950° C.

8. The method of claim 1, wherein said annealing is carried out a temperature of up to and including 1100° C.

9. The method of claim 1, wherein said dopant ion is implanted as a positive ion.

10. The method of claim 1, wherein said annealing step is carried out for about 1 to about 5 hours.

* * * * *